(12) United States Patent
Bleeker et al.

(10) Patent No.: US 7,859,647 B2
(45) Date of Patent: Dec. 28, 2010

(54) LITHOGRAPHIC APPARATUS AND DEVICE MANUFACTURING METHOD

(75) Inventors: Arno Jan Bleeker, Westerhoven (NL); Johannes Jacobus Matheus Baselmans, Orischot (NL); Marce Mathijs Theodore Marie Dierichs, Venlo (NL); Stanislav Smirnov, Bethel, CT (US); Christian Wagner, Eersel (NL); Lev Ryzhikov, Norwalk, CT (US); Kars Zeger Troost, Waalre (NL)

(73) Assignee: ASML Holding N.V., Veldhoven (NL)

( * ) Notice: Subject to any disclaimer, the term of this patent is extended or adjusted under 35 U.S.C. 154(b) by 431 days.

(21) Appl. No.: 12/020,947

(22) Filed: Jan. 28, 2008

(65) Prior Publication Data

US 2008/0137053 A1    Jun. 12, 2008

Related U.S. Application Data

(62) Division of application No. 11/020,567, filed on Dec. 27, 2004, now abandoned.

(51) Int. Cl.
     *G03B 27/54*    (2006.01)
     *G03B 27/42*    (2006.01)

(52) U.S. Cl. .......................................... 355/67; 355/53

(58) Field of Classification Search .................. 355/52, 355/53, 55, 67–71; 356/399–401; 250/548
See application file for complete search history.

(56) References Cited

U.S. PATENT DOCUMENTS

| | | | |
|---|---|---|---|
| 3,923,382 A | 12/1975 | Harding | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,691,541 A | 11/1997 | Ceglio et al. | |
| 5,808,797 A | 9/1998 | Bloom et al. | |
| 5,943,171 A | 8/1999 | Budd et al. | |

(Continued)

FOREIGN PATENT DOCUMENTS

EP    1 262 836 A1    12/2002

(Continued)

OTHER PUBLICATIONS

Search Report, dated Jan. 7, 2008, for EP Patent Appl. No. 05 257 885.2-2222 dated Jan. 7, 2008, 6 pgs.

(Continued)

*Primary Examiner*—Hung Henry Nguyen
(74) *Attorney, Agent, or Firm*—Sterne, Kessler, Goldstein & Fox P.L.L.C.

(57) ABSTRACT

A system and method are used to direct a radiation beam to illuminate non-perpendicularly a patterning array of individually controllable elements used for patterning the radiation beam. The individually controllable elements can change a telecentricity of the radiation beam. Projection of the radiation beam onto the individually controllable elements can be by a concave mirror or use a folding mirror placed in an object field of the individually controllable elements. Alternatively, the individually controllable elements can change the optical axis of the radiation beam.

10 Claims, 13 Drawing Sheets

U.S. PATENT DOCUMENTS

| | | | |
|---|---|---|---|
| 5,982,553 A | 11/1999 | Bloom et al. | |
| 6,133,986 A | 10/2000 | Johnson | |
| 6,177,980 B1 | 1/2001 | Johnson | |
| 6,295,164 B1 * | 9/2001 | Murakami et al. | 359/584 |
| 6,359,676 B1 | 3/2002 | Treiber et al. | |
| 6,438,199 B1 | 8/2002 | Schultz et al. | |
| 6,545,758 B1 | 4/2003 | Sandstrom | |
| 6,583,856 B1 | 6/2003 | Takahashi | |
| 6,687,041 B1 | 2/2004 | Sandstrom | |
| 6,737,662 B2 | 5/2004 | Mulder et al. | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,870,554 B2 | 3/2005 | Jain | |
| 6,870,601 B2 | 3/2005 | Liebregts et al. | |
| 6,897,940 B2 * | 5/2005 | Sogard | 355/55 |
| 6,906,781 B2 * | 6/2005 | Berger | 355/53 |
| 7,070,289 B2 | 7/2006 | Sasaki et al. | |
| 7,167,296 B2 * | 1/2007 | Meisburger | 359/290 |
| 2002/0030636 A1 | 3/2002 | Richards | |
| 2003/0043356 A1 | 3/2003 | Shiraishi | |
| 2003/0067598 A1 | 4/2003 | Tomie | |
| 2004/0114217 A1 | 6/2004 | Mann et al. | |
| 2004/0130561 A1 | 7/2004 | Jain | |
| 2005/0007572 A1 | 1/2005 | George et al. | |
| 2005/0147895 A1 | 7/2005 | Chang et al. | |
| 2006/0138349 A1 | 6/2006 | Bleeker et al. | |

FOREIGN PATENT DOCUMENTS

| | | |
|---|---|---|
| EP | 1 450 209 A1 | 8/2004 |
| JP | 10-274740 | 10/1998 |
| JP | 2003-114200 | 4/2003 |
| JP | 2004-039862 | 2/2004 |
| KR | 2002-0092207 | 12/2002 |
| KR | 2004-0075784 | 8/2004 |
| WO | WO 98/33096 A1 | 7/1998 |
| WO | WO 98/38597 A2 | 9/1998 |
| WO | WO 98/38597 A3 | 9/1998 |
| WO | WO2004-019079 A2 | 3/2004 |
| WO | WO 2005/026843 A2 | 3/2005 |

OTHER PUBLICATIONS

Search Report, dated Oct. 20, 2006, for EP Patent Appl. No. 05257885.3-2222, 6 pages.

Office Action, dated Oct. 18, 2006, for KR Patent Appl. No. 10-2005-0129704, 2 pages.

Japanese Patent Abstract, Pub. No. 10-274740, published Oct. 13, 1998, 1 pg.

Japanese Patent Abstract, Pub. No. 2004-039862, published Feb. 5, 2004, 1 pg.

* cited by examiner

… (US 7,859,647 B2)

LITHOGRAPHIC APPARATUS AND DEVICE MANUFACTURING METHOD

CROSS-REFERENCE TO RELATED APPLICATIONS

This application is a divisional of U.S. patent application Ser. No. 11/020,567, filed Dec. 27, 2004 (now abandoned), which is hereby incorporated by reference in its entirety.

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

In a maskless lithographic apparatus, a polarizing beam splitter is generally used to project the radiation beam onto the individually controllable elements. The radiation beam is projected through the beam splitter twice and a quarter wave plate is used to change the polarization of the radiation beam after first transmission through the beam splitter and before the second transmission through the beam splitter. Use of the polarization to control the direction of the radiation beam means that the cross section of the radiation beam has a uniform polarization, and thus different polarizations cannot be used to create different effects during the exposure. Also, beam splitters are inefficient and can be difficult to thermally control.

A non-polarizing beam splitter, with a half silvered mirror, can be used instead of a polarizing beam splitter to avoid polarization issues, but with two passes through such a device about 75% or more of the radiation is lost, substantially reducing throughput.

Therefore, what is needed is a system and method including a lithographic apparatus in which beam splitters are no longer necessary.

SUMMARY

According to one embodiment of the present invention, there is provided a lithographic apparatus comprising an illumination system, an array of individually controllable elements, and a projection system. The illumination system conditions a radiation beam. The array of individually controllable elements patterns the radiation beam. The projection system projects the patterned radiation beam onto a target portion of a substrate. The radiation beam illuminates the array of individually controllable elements non-perpendicularly.

In one example, the individually controllable elements can change the telecentricity of the radiation beam. This can be done by providing a folding mirror or prism in the object field of the individually controllable elements or a concave optical element to project the radiation beam onto the individually controllable elements.

In another example, the individually controllable elements can change the optical axis of the radiation beam. There can further be a reflecting device constructed to project the radiation beam onto the array of individually controllable elements. In one example, the individually controllable elements are arranged to change the optical axis of the radiation beam after reflection by the individually controllable elements to be different from the optical axis of the radiation beam prior to reflection by the individually controllable elements. In another example, the lithographic apparatus can comprise aspheric optical elements for projecting the radiation beam.

According to one embodiment of the present invention, there is provided a device manufacturing method comprising the following steps. Patterning a beam of radiation using an array of individually controllable elements. Projecting the pattern beam onto a substrate. Illuminating the individually controllable elements with the beam of radiation non-perpendicularly.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 depicts a lithographic apparatus, according to one embodiment of the present invention.

FIGS. 2, 3, and 4 depict non-telecentric illumination of individually controllable elements, according to various embodiments of the present invention.

FIG. 5 depicts a layout of individually controllable elements in one or more of the arrangements shown in one of FIG. 2, 3, or 4, according to one embodiment of the present invention.

FIGS. 6, 7, 8, 9, 10, 11, 12, 13, 14, and 15 show additional non-telecentric illumination of individually controllable elements, according to various embodiments of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Figure 1:
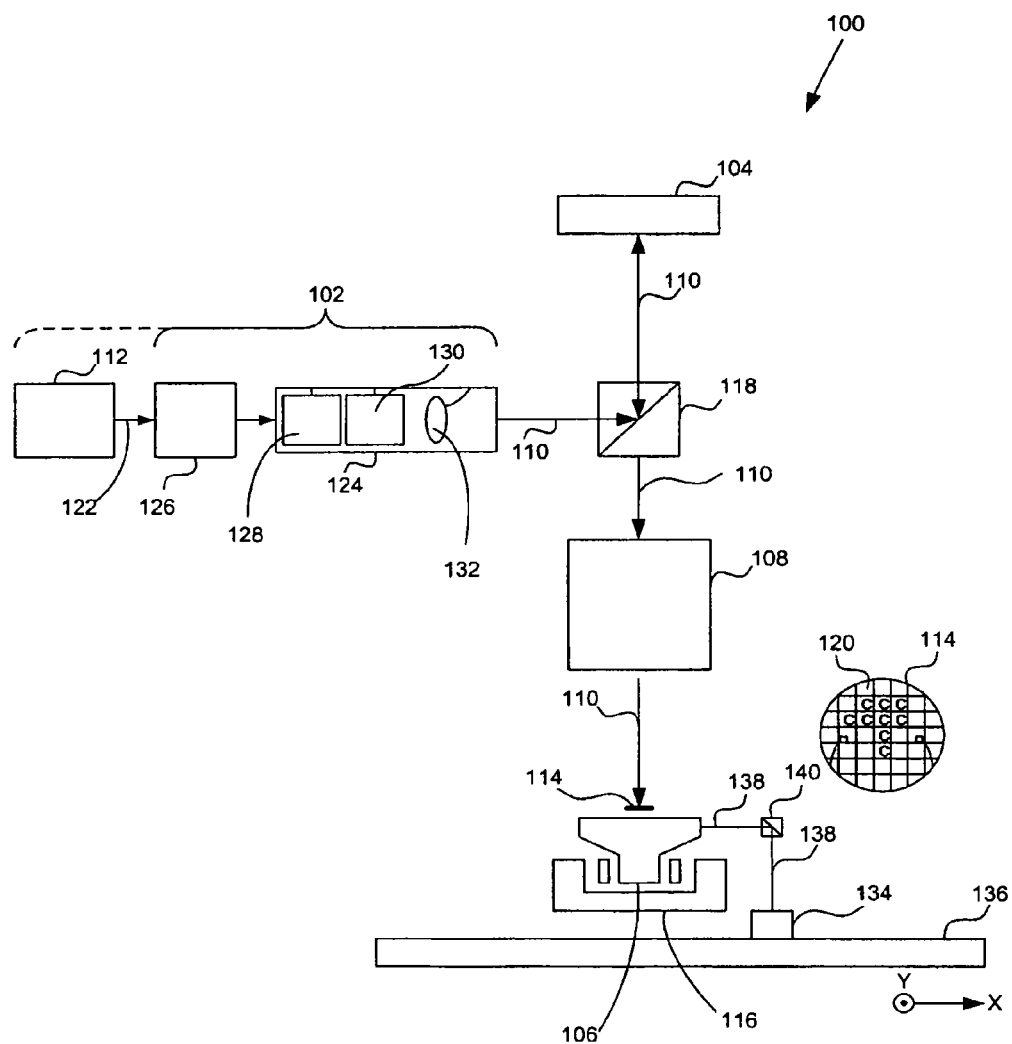

Throughout the remainder of this specification the terms "alignment mark" and "alignment marks" will be used to denote one or more individual, indiscrete alignment marks respectively, unless otherwise stated. By "individual" it is meant that each alignment mark is separate and distinct from others of its kind (i.e., from the other alignment marks). By "indiscrete" it is meant that each alignment mark is not divided into parts (e.g., each alignment mark is a single, undivided entity). A variety of such marks can be used in embodiments of the invention, and it will be appreciated that the dots, dashes, and lines referred to in this specification are merely specific examples. Other forms can be used.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used. For example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a shortstroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Figure 2:
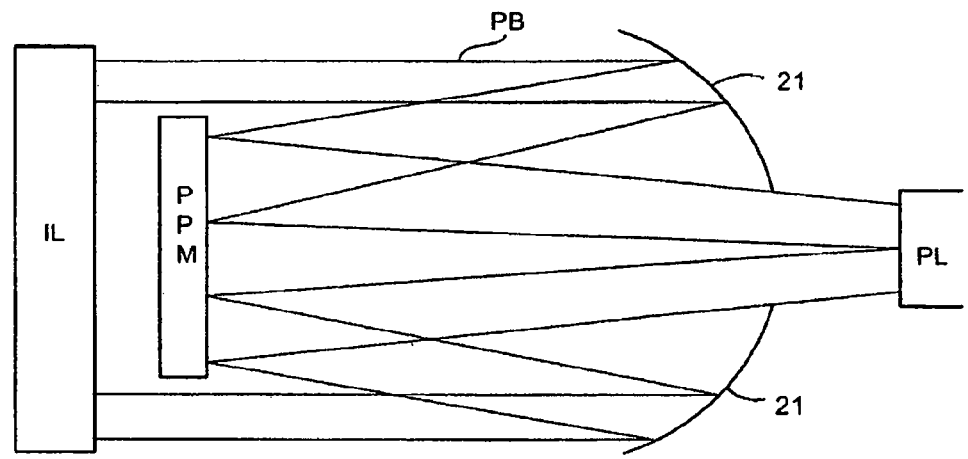
Figure 3:
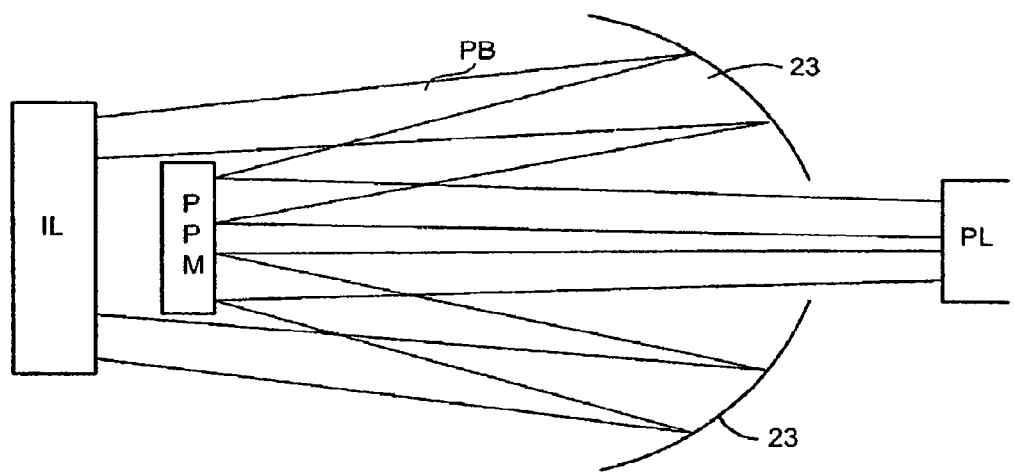
Figure 4:
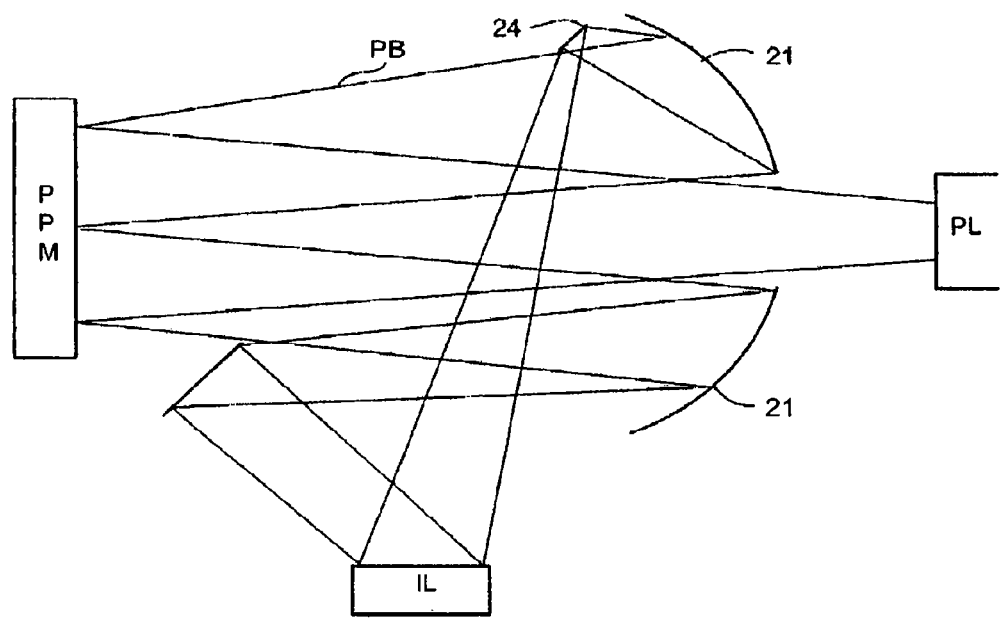

FIGS. 2, 3, and 4 depict non-telecentric illumination of individually controllable elements, according to various embodiments of the present invention.

As shown in FIG. 2, a radiation beam PB is a plane parallel beam projected from an illuminator IL behind the patterning array of individually controllable elements PPM (i.e., the chief rays at points across the patterning array are parallel to each other) towards a concave mirror 21. Concave mirror 21 is annular. The axis of the concave mirror is aligned on the optical axis of the radiation beam PB, the projection system PL, and the array of individually controllable elements PPM. The concave mirror 21 reflects the radiation beam towards the front side of the individually controllable elements PPM where a pattern is applied to the radiation beam.

As can be seen from FIG. 2, the radiation beam PB is not perpendicular to the patterning array PPM and the patterning array changes the telecentricity of the radiation beam PB. The patterned radiation beam PB is then reflected towards concave mirror 21 and is transmitted through the hole in this mirror into the projection system PL.

Using this arrangement of optical elements, no beam splitter cube is necessary and thus a beam of any polarization can be used. Indeed, different parts of the radiation beam PB can have different polarizations and can be used in different ways during the imaging part of the process. Any loss of light on reflection is less than the loss of light due to polarization effects when a beam splitter is used and the mirrors used can be better controlled resulting in a more accurate optical system.

Also, no lenses are necessary between the concave mirror 21 and the patterning array PPM. Thus, this imaging part of the apparatus can be made smaller.

Although in this example a single concave mirror 21 is shown, the concave mirror 21 can be made up of many small mirrors forming a concave shape. Thus, all the mirrors forming the concave shape have a common radius of curvature and a common optical axis. In this example, each individually controllable element of the patterning array PPM can have a corresponding mirror element. As the mirror elements are used only to reflect the radiation beam PB prior to reflection by the individually controllable elements, the quality of the mirror 21 or mirror element is not as crucial as for elements used either after reflection by the individually controllable elements or both before and after reflection by the individually controllable elements.

As shown in FIG. 3, a divergent radiation beam PB is projected towards a concave mirror 23. Concave mirror 23 has a smaller radius of curvature than that shown in FIG. 2. The concave mirror 23 reflects the radiation beam PB towards the individually controllable elements of patterning array PPM. By using a concave mirror with a smaller radius of curvature, the size of the optical element within the illuminator IL can be reduced.

As shown in FIG. 4, a folding mirror 24 with a central hole is positioned between concave mirror 21 and patterning array PPM and is arranged at an angle of approximately 45° to the optical axis of the concave mirror 21 and the array PPM. The radiation beam PB is projected from the illuminator IL and reflected by the folding mirror 24 onto a path having the same optical axis as the concave mirror 21 and array PPM. The radiation beam PB is reflected by the concave mirror and the individually controllable elements of array PPM to be transmitted towards the projection system PL.

Although, in this example, the illuminator is arranged perpendicularly to the optical axis of the projection system, and the folding mirror 24 at 45° to the projection system PL, the position of the illuminator IL can be varied according to the arrangement of the apparatus and the angle of the folding mirror varied accordingly.

Figure 5:
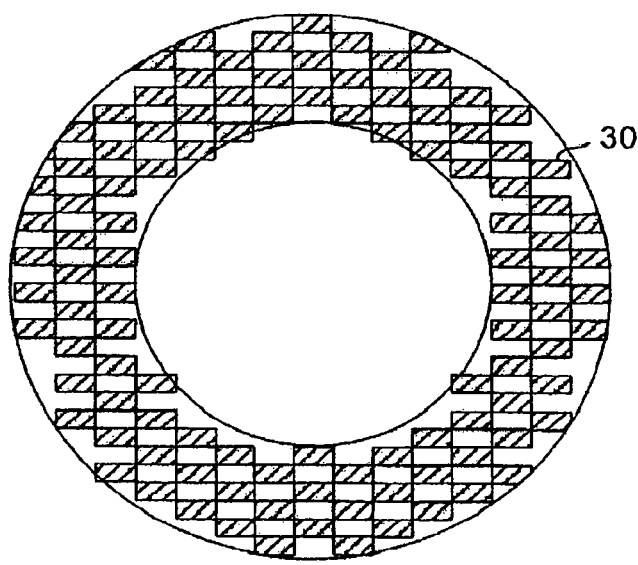

FIG. 5 depicts a layout of individually controllable elements PPM in one or more of the arrangements shown in one of FIG. 2, 3, or 4, according to one embodiment of the present invention. In the embodiments above, the object fields 30 of the individually controllable elements of array PPM are arranged in an annulus as shown in FIG. 5.

FIGS. 6, 7, 8, 9, 10, 11, 12, 13, 14, and 15 show additional non-telecentric illumination of individually controllable elements, according to various embodiments of the present invention.

Figure 6:
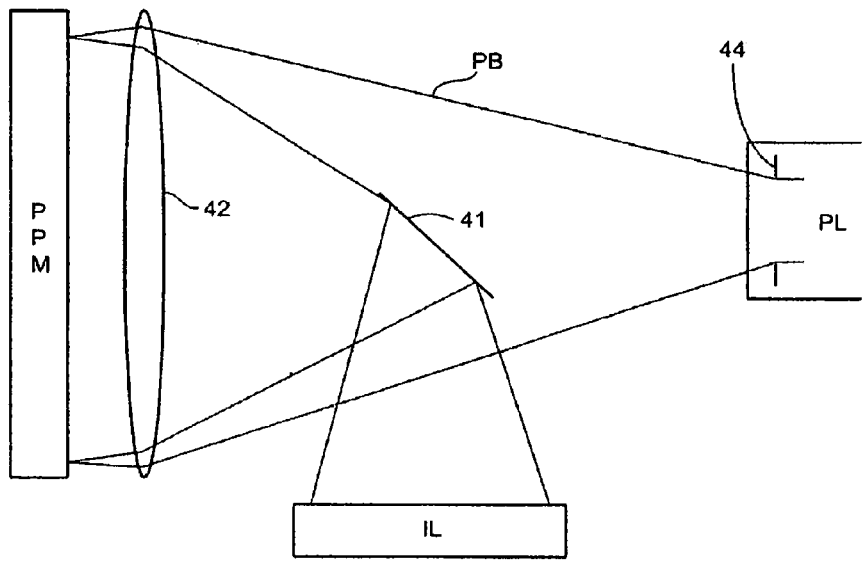

In the embodiment shown in FIG. 6 fields of individually controllable elements of the array PPM are arranged within an annular area, as illustrated in FIG. 5, for example. The radiation beam PB from an illuminator IL is reflected by a folding mirror or prism 41 arranged at approximately 45° to the optical axis of the main projection system PL towards the array. Folding mirror or prism 41 is small enough to be in the object field but not the image field of the individually controllable elements PPM. In front of the patterning array PPM is an element 42 with a positive optical power (e.g., a convex lens or a lens group) through which the radiation beam PB is transmitted both before and after reflection by the individually controllable elements of array PPM. The element 42 functions to focus the radiation beam towards an aperture stop 44 of projection system PL. The aperture stop 44, the element 42, the patterning array PPM and the folding mirror or prism 41 are all arranged on the same optical axis as the projection system PL.

As no beam splitter is used, the polarization is a free variable and can be used for imaging and there is less loss of light.

Figure 7:
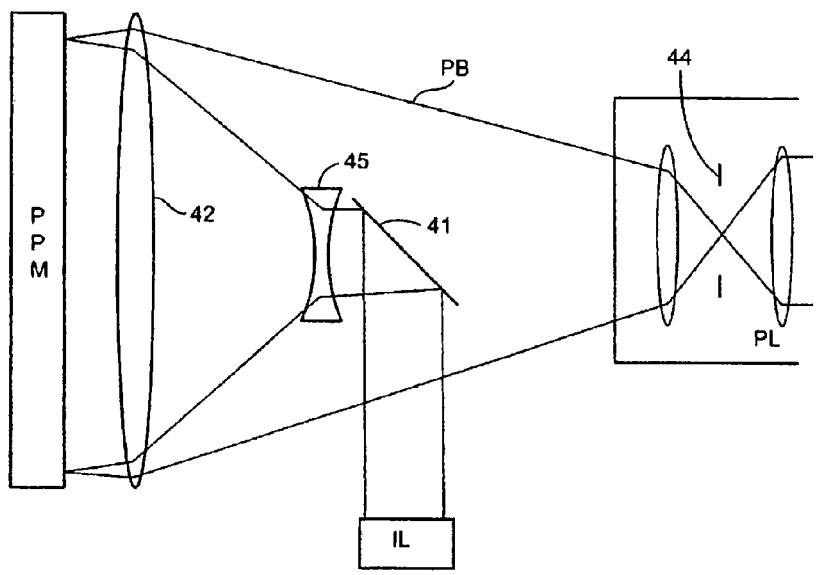

As shown in FIG. 7, an element 45 with negative optical power (e.g., a concave lens or lens group) is placed between the folding mirror or prism 41 and the convex lens 42. Element 45 is arranged on the same optical axis as the other optical elements 41, 42, 44 and is sufficiently small to be in the path of the radiation beam prior to reflection by the individually controllable elements, but not after reflection by them. Element 45 increases the divergence of the radiation beam PB so smaller, cheaper optical elements can be used within the illuminator IL.

Figure 8:
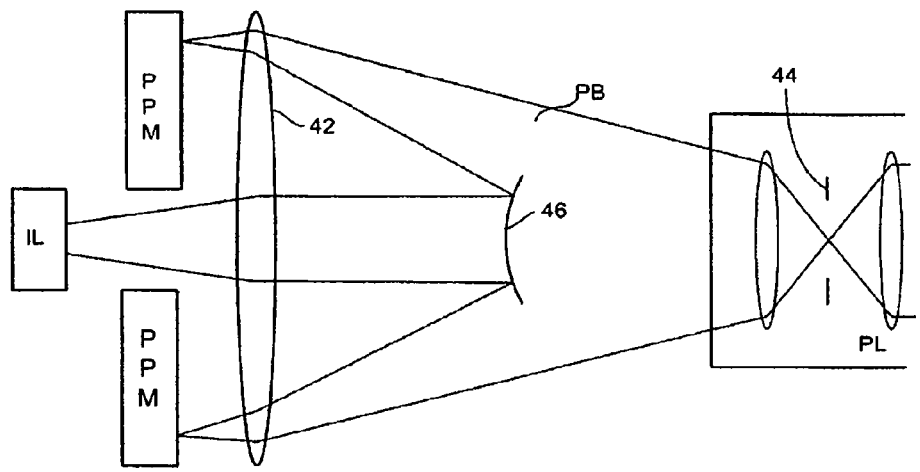

In the embodiment shown in FIG. 8, the individually controllable elements PPM form an annular shape and the radiation beam PB is projected from the illuminator IL through the hole at the center of the PPM annulus towards a mirror 46. Mirror 46 can have convex or concave shape. In this embodiment, a convex mirror is shown. After reflection by mirror 46 the radiation beam diverges and is transmitted through element 42 which has a positive optical power (e.g., a convex lens or lens group) onto individually controllable elements PPM. Mirror 46 shares the same optical axis as the illuminator IL, element 42 and the projection system PL. Mirror 46 is sufficiently small to reflect the radiation beam PB only before reflection by individually controllable elements and not after reflection.

In this embodiment, the illuminator IL can occupy space behind the PPM patterning array leading to a more compact device.

Figure 9:
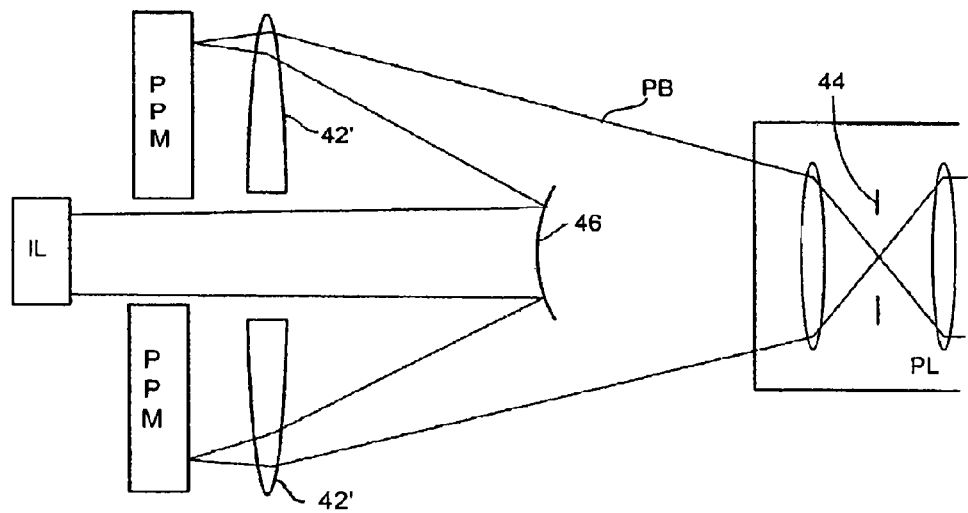

In the embodiment shown in FIG. 9, element 42' is annular. Radiation beam PB is projected through the hole at the center of annular element 42' towards mirror 46. This results in better transmission of the radiation beam PB prior to reflection by the individually controllable elements of array PPM.

Figure 10:
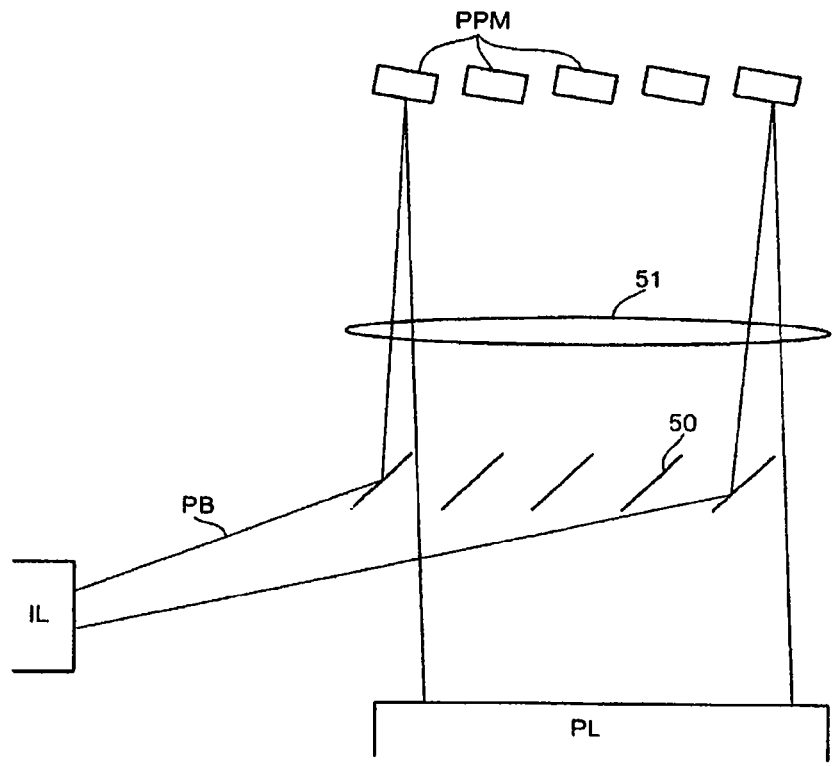

As can be seen in the embodiment of FIG. 10, the individually controllable elements PPM in this embodiment change the optical axis of the radiation beam PB. After reflection by the individually controllable elements the radiation beam PB is projected towards the projection system PL. Each individually controllable element or group of elements of array PPM has a corresponding mirror 50 used to reflect the radiation beam PB. In one example, to prevent loss of light only the mirrors 50 are illuminated and not the spaces between the mirrors. The individually controllable elements reflecting the radiation beam PB towards the projection system PL are arranged at a small angle of approximately 0.1 rad to the optical axis of the projection system PL. After reflection by the individually controllable elements PPM the radiation beam PB is projected through the spaces between the mirrors 50. In one example, the image field of each individually controllable element or group is projected through the space adjacent to the mirror by which the object field of the same individually controllable element has been reflected. As no beam splitter is used in this embodiment, the polarization is again a free variable and can be used advantageously for imaging.

Figure 11:
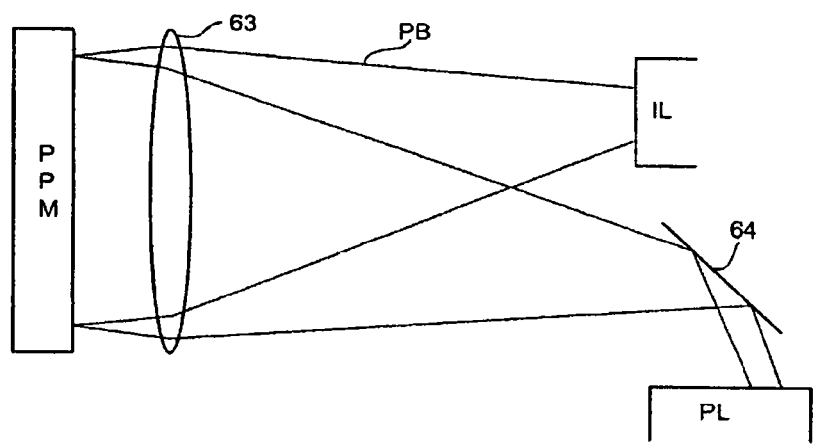

As can be seen in the embodiment FIG. 11, the incoming radiation beam PB from illumination system IL is projected onto the array PPM of individually controllable elements through lens 63, which can be a single lens element or made up of a group of lenses. Convex lens 63 is arranged close to the individually controllable elements such that the radiation beam PB is transmitted through convex lens 63 both prior to and after reflection by the individually controllable elements. The individually controllable elements are arranged to change the optical axis of the radiation beam. The radiation beam PB is then projected through convex lens 63 for a second time. Mirror 64 is arranged at 45° to the radiation beam to conveniently direct the beam into the projection system. As the entrance and exit pupils of this system are physically separate, the precise locations can be varied according to the requirements of the particular apparatus.

Figure 12:
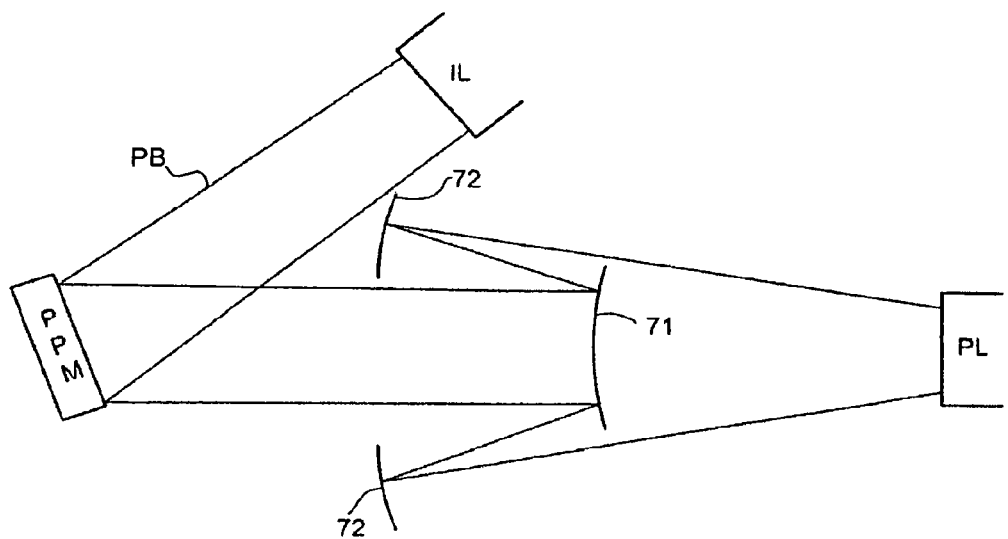

As shown in FIG. 12, the patterning array PPM is illuminated at an oblique angle. After reflection by the individually controllable elements the radiation beam PB is transmitted towards convex aspheric reflecting optical element 71, which reflects radiation beam PB towards annular aspheric reflecting optical elements 72. The radiation beam PB is then projected towards projection system PL. Optical elements 71 and 72 form a Schwarzschild 2-mirror design but other telescopic designs such a Ritchey-Chrétien design could be used. By using such off-axis telescopic design the optical path differences introduced by the off-axis illumination of the individually controllable elements PPM can be minimized.

In at least this embodiment, the use of mirrors instead of a beam splitter cube yields the advantage that there is no light loss due to the polarization effects. Furthermore the mirrors used instead can be better controlled resulting in a more accurate optical system. In this embodiment the mirror system can also have a magnification, reducing the need for further subsequent magnification.

Figure 13:
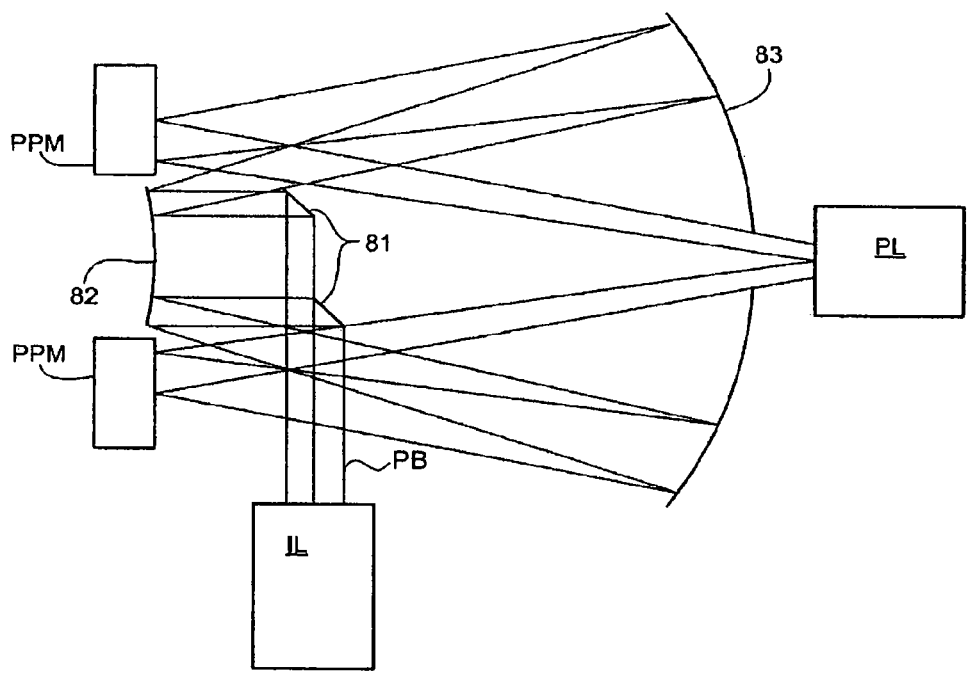

In the embodiment shown in FIG. 13, the illumination system IL directs a beam of radiation PB onto a first mirror 81, which can be embodied as two or more part mirrors or one larger mirror. First mirror 81 directs the radiation onto a second mirror 82, which is positioned between the two parts of a divided patterning array PPM. The second mirror 82 directs the radiation beam PB' onto third mirror 83 which is set in front of the patterning array, which directs the radiation onto the individually controllable elements. Third mirror 83 has an aperture to allow the patterned beam to pass into the projection lens. It will be appreciated that while the second mirror 82 is shown as convex, it can also be plane or concave.

Figure 14:
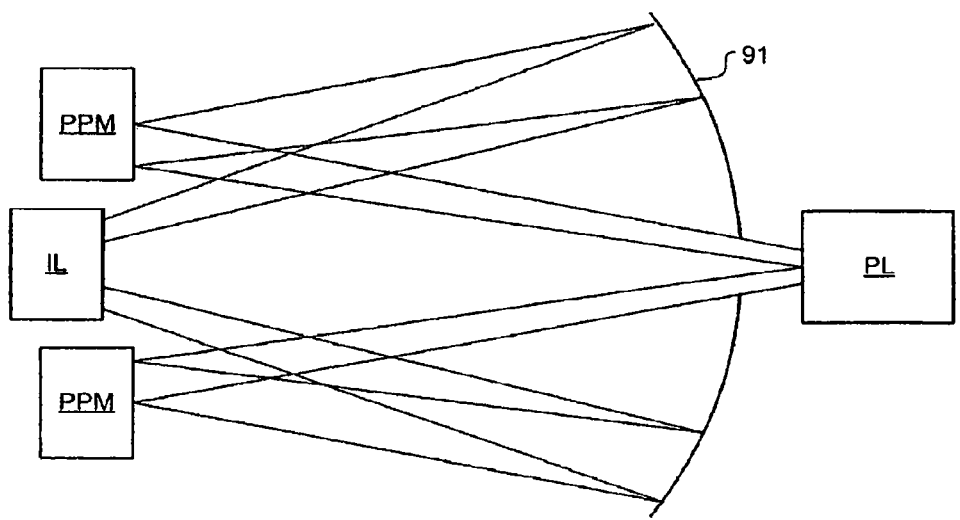

In the embodiment shown in FIG. 14, the first and second mirrors of FIG. 13 are omitted and the output of the illumination system IL is arranged between the parts of the patterning array PPM. The illumination system outputs two sub-beams which are directed onto a concave mirror 91 set in front of the patterning array PPM. Concave mirror 91 directs the radiation back onto the patterning array and has an aperture to allow the patterned beam to pass into the projection system.

Figure 15:
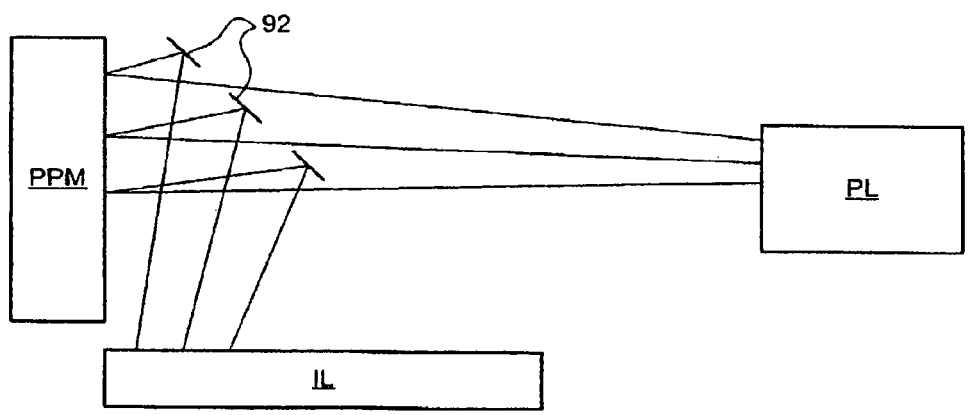

In the embodiment shown in FIG. 15, the illuminator is set to one side and directs radiation onto a folding mirror 92 which directs radiation onto the patterning array PPM. The folding mirror 92 has a plurality of apertures corresponding to the plurality of individually controllable elements in the patterning array to allow the beamlets reflected by the elements to pass into the projection system PL. In this embodiment, the array of individually controllable elements is quite sparse.

Figure 16:
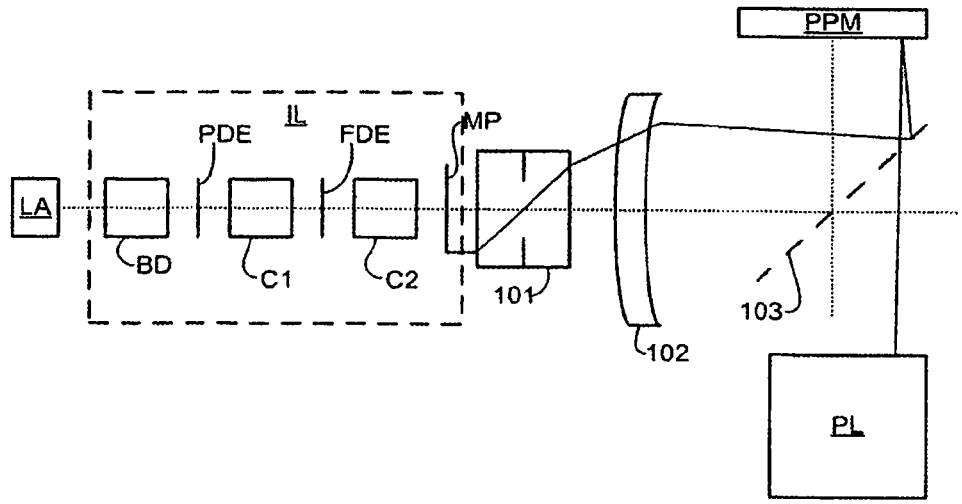
FIG. 16 is an overall schematic of an illumination system, patterning array, projection system PL and radiation coupling arrangement, according to one embodiment of the present invention.
Figure 17:
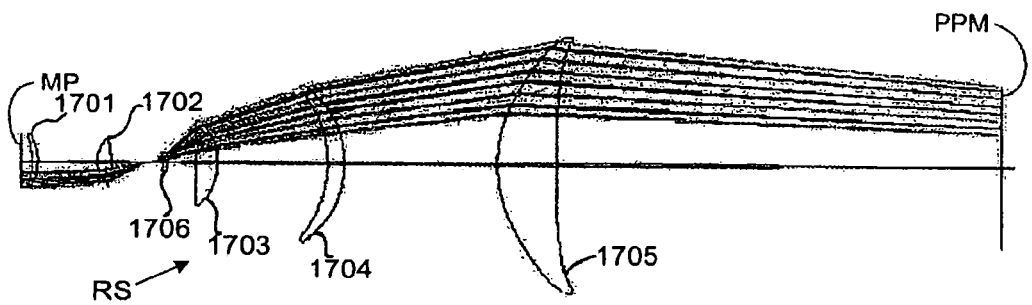
FIGS. 17 and 18 are alternative optical designs for a relay system, according to various embodiments of the present invention.
Figure 18:
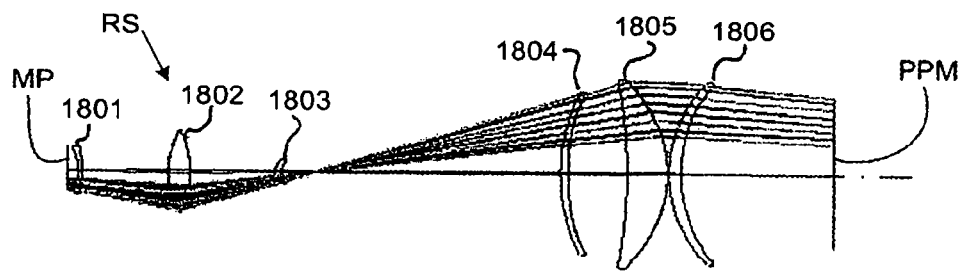

FIG. 16 is an overall schematic of the illumination system IL, patterning array PPM, projection system PL and radiation coupling arrangement (1601, 1602, and 1603), while FIGS. 17 and 18 are alternative optical designs for a relay system (1601, 1602, and 1603) that relays of radiation from a mask plane MP in the illuminator IL to the plane of the patterning array PPM. It should be noted that FIGS. 17 and 18 are "unfolded," omitting the apertured folding mirror 102 shown in FIG. 16.

In FIG. 16, the illumination system IL comprises a telecentric part which receives light from radiation source LA via beam delivery optics BD. The telecentric part comprises a first diffractive optical element PDE which defines the pupil. The telecentric part also includes zoomable condenser optics C1, second diffractive optical element FDE, which is filled by the first diffractive optical element and defines the field, and fixed condenser optics C2, which provides uniform illumination of the mask plane MP. The relay system, comprising first relay lens group 1601, second relay lens group 1602 and apertured folding mirror 1603 is non-telecentric and projects an image of the mask plane onto the patterning array.

In FIG. 17, a relay system RS includes optical elements 1701, 1702, 1703, 1704, 1705, and 1706, while in FIG. 18 a relay system RS includes optical element 1801, 1802, 1803, 1804, 1805, and 1806. In one example, the optical elements are either concave, convex, or other types of lenses, as shown. It is to be appreciated other types and configurations of lenses are also contemplated.

Figure 19:
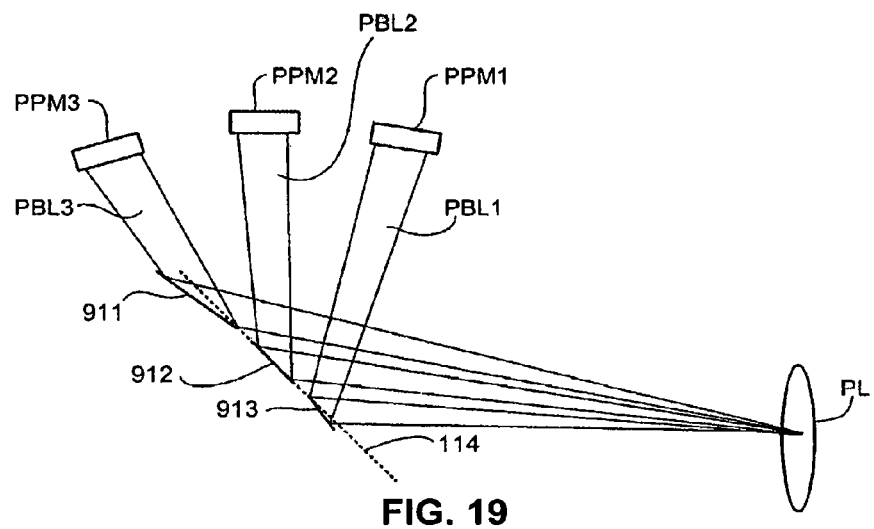
FIG. 19 depicts patterning arrays, projection system and radiation coupling arrangement, according to one embodiment of the present invention.

FIG. 19 depicts patterning arrays, a projection system and a radiation coupling arrangement, according to one embodiment of the present invention. FIG. 19 shows how relay mirrors set at different angles to a plane can be used to couple beamlets from a sparse arrangement of patterning arrays into the projection system. The various patterning arrays PPM1-PPM3 are spaced apart in locations that are convenient for the peripheral electronics and mechanics, e.g. drive circuitry and positioning systems, of each array. Mirrors 1911-1913 are then set at appropriate angles relative to a plane 1914 to couple the patterned sub-beams PBL1-PBL3 into the projection system PL.

Figure 20:
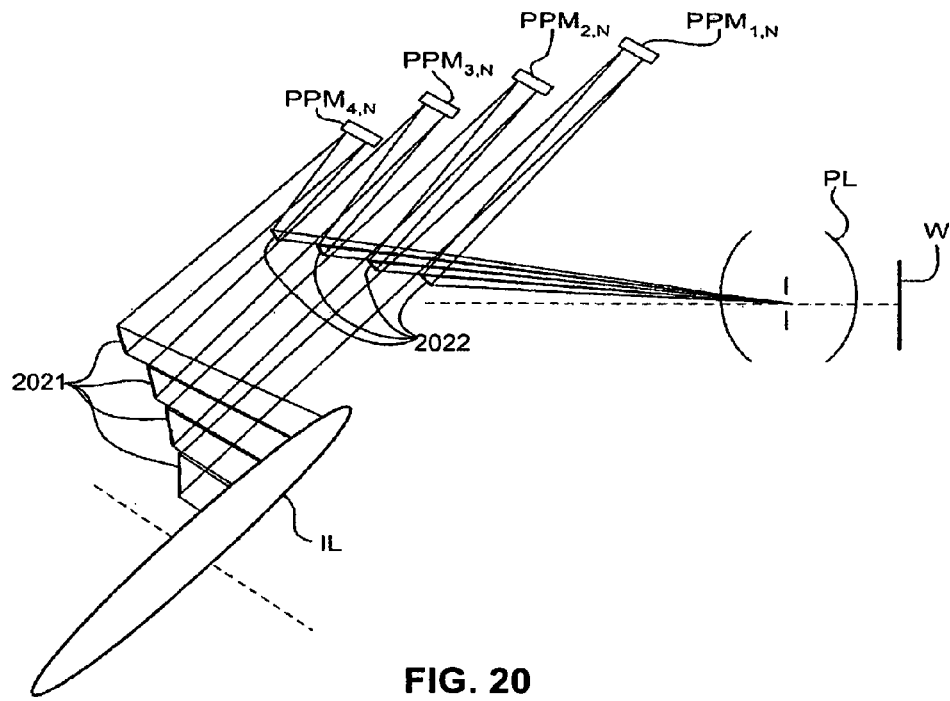
FIG. 20 depicts an illumination system, patterning arrays, projection system and radiation coupling arrangement, according to one embodiment of the present invention.

FIG. 20 depicts an illumination system, patterning arrays, projection system, and radiation coupling arrangement, according to one embodiment of the present invention. This embodiment allows extensive, but well separated, arrays of patterning arrays to be coupled into the projection system. This figure shows a section through the illumination and coupling arrangements, with one patterning array from each of several rows of arrays.

Figure 21:
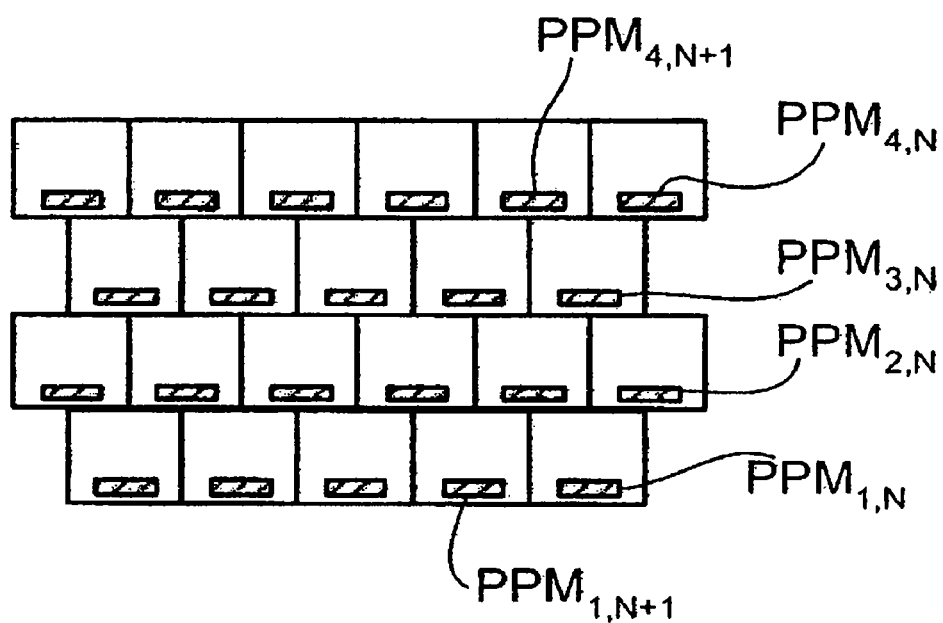
FIG. 21 depicts an arrangement of patterning arrays, according to one embodiment of the present invention.

FIG. 21 depicts an example arrangement of patterning arrays, according to one embodiment of the present invention. The array is shown as viewed from the illumination system. Of course, a different number of patterning arrays arranged in different numbers of rows and columns can be used.

Referring to both FIGS. 20 and 21, first coupling mirrors 2021 are disposed on a curved surface and serve to direct radiation output by the illumination system onto respective ones of the patterning arrays $PPM_{1,1}$ to $PPM_{4,N}$, which modulate the beam according to their respective parts of the pattern to be imaged. The sub-beams reflected from the patterning arrays are then coupled into the projection system PL by second coupling mirrors 2022 which are arranged in the spaces between the sub-beams formed by first coupling mirrors 2021. Although the patterned beamlets are combined into a single beam carrying a combined image in the projection system PL, the patterning arrays can be arranged in a comparatively sparse array allowing for plenty of room for peripheral electronics and mechanics.

Figure 22:
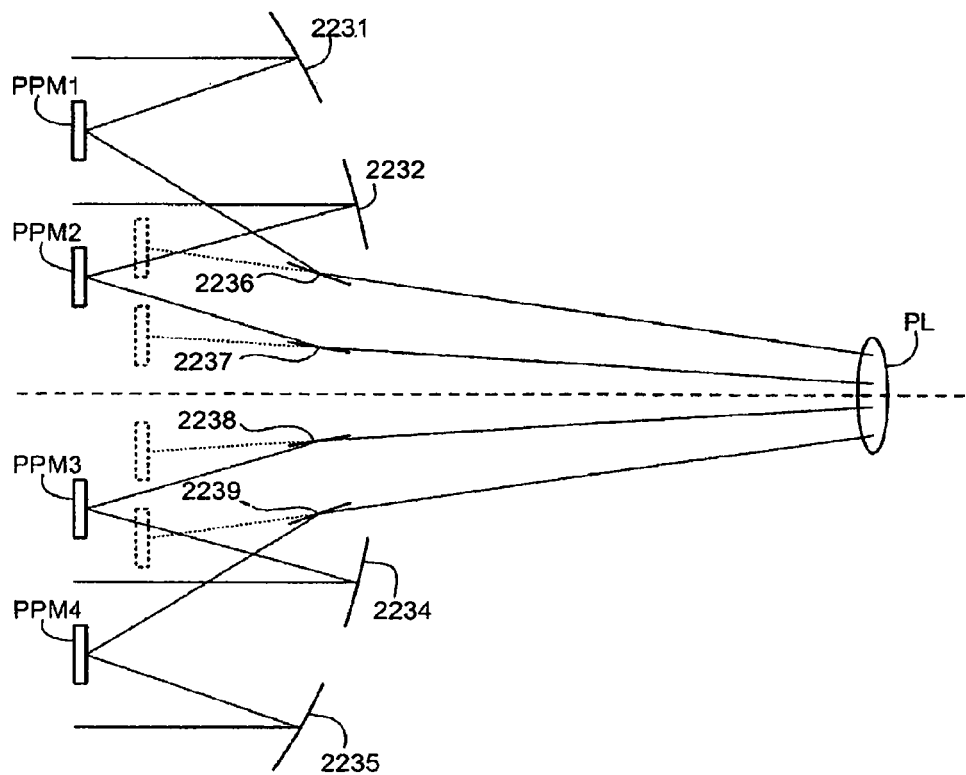
FIG. 22 depicts an illumination system, patterning arrays, projection system and radiation coupling arrangement, according to one embodiment of the present invention.

FIG. 22 depicts an illumination system, patterning arrays, projection system and radiation coupling arrangement, according to one embodiment of the present invention. Grazing incidence mirrors 2236-2239 are used to generate a virtual dense grid of patterning arrays when using a sparse grid of patterning arrays. As can be seen, a set of illuminator mirrors 2231-2235, which can be segments of a single large radius mirror, direct radiation from the illumination system (not shown) onto the patterning arrays PPM1-PPM4. The selectively reflected sub-beams from each patterning array are then coupled into the projection system PL by grazing incidence mirrors 2236-2239. Viewed from the projection system PL, the patterning arrays appear to occupy a much denser grid, as shown by the dotted outlines in the figure.

Figure 23:
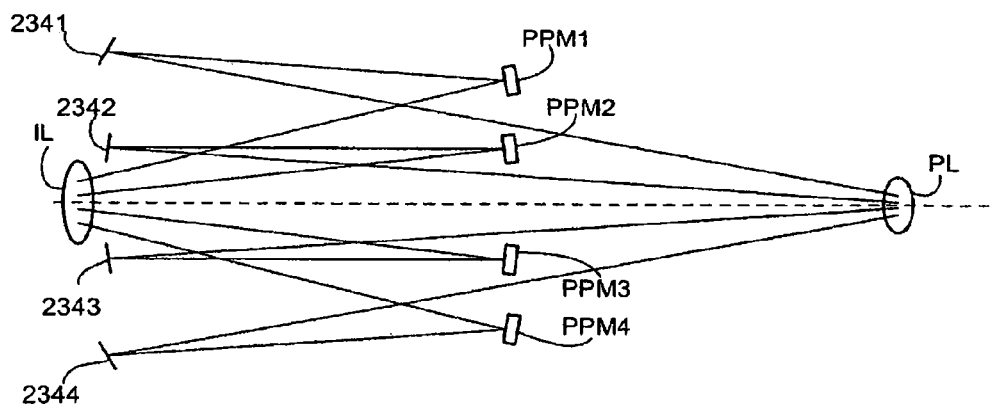
FIG. 23 depicts an illumination system, patterning arrays, projection system and radiation coupling arrangement, according to one embodiment of the present invention.

FIG. 23 depicts an illumination system, patterning arrays, projection system and radiation coupling arrangement, according to one embodiment of the present invention. The patterning arrays PPM1-PPM4 are set in a plane, but angled so that the selectively reflected sub-beams are directed onto coupling mirrors 2341-2344, which direct them into projection system PL. The arrangement allows for a virtual dense array of patterning arrays, as seen from the projection system, as well as near-perpendicular incidence on the patterning arrays and coupling mirrors, allowing polarization control. A smaller lens PL can be used in the illumination system IL, as compared to lens PL in FIG. 22, and the folding increases the path length, reducing the telecentricity angle in the projection system. The beam paths from coupling mirrors 2341-2344 to projection system pass through spaces between the patterning arrays.

Figure 24:
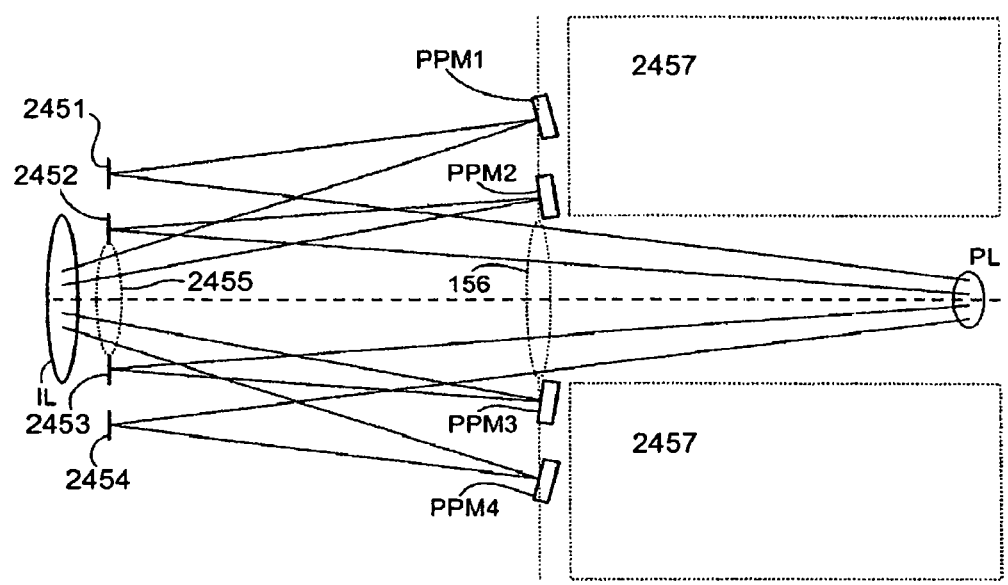
FIG. 24 depicts an illumination system, patterning arrays, projection system and radiation coupling arrangement, according to one embodiment of the present invention.

FIG. 24 depicts an illumination system, patterning arrays, projection system and radiation coupling arrangement, according to one embodiment of the present invention. Beam paths are arranged so that all the beam paths from the coupling mirrors 2451-2454 to the projection system PL pass through a single aperture 2456 in the support structure for the patterning arrays PPM1-PPM4. This allows a relatively large annular space 2457 for peripheral electronics, mechanics and cabling for the patterning arrays. Similarly, all beam paths from the illumination system IL to the patterning arrays PPM1-PPM4 pass through a single aperture in the array of coupling mirrors 2451-2454.

While specific embodiments of the invention have been described above, it will be appreciated that the invention can be practiced otherwise than as described. In particular, the positions of the illumination and projection systems can be exchanged in the described embodiments. The patterning array in each embodiment can comprise a plurality of elements arrayed across a single substrate, but equally can comprise several substrates each carrying an array of elements. The array of elements need not be regular, but can be distributed as best suits the illumination arrangements and coupling of the patterned beam into the projection system. Many of the embodiments are illustrated in two dimensional form but have rotational symmetry so can be replicated in more complex arrangements in three dimensions. The description is not intended to limit the invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all, exemplary embodiments of the present invention as contemplated by the inventor(s), and thus, are not intended to limit the present invention and the appended claims in any way.

What is claimed is:

1. A lithographic apparatus, comprising:
an illumination system configured to condition a radiation beam;
an array of individually controllable elements configured to pattern the radiation beam;
a plurality of minors disposed between the illumination system and the array of individually controllable elements, wherein respective ones of the plurality of mirrors are configured to project the radiation beam onto corresponding elements in the array of individually controllable elements; and
a projection system configured to project the patterned radiation beam onto a target portion of a substrate,
wherein the radiation beam is arranged to illuminate the array of individually controllable elements non-perpendicularly and non-telecentrically, and wherein the array of individually controllable elements changes an optical axis and the telecentricity of the radiation beam.

2. The apparatus of claim 1, wherein a reflective surface of the corresponding element of the array of individually controllable elements is arranged at angle with respect to a longitudinal central axis of the projection system.

3. The apparatus of claim 2, wherein the angle is approximately 0.1 radians.

4. The apparatus of claim 1, wherein a reflective surface of each element of the array of individually controllable elements is arranged at an angle with respect to a longitudinal central axis of the projection system.

5. The apparatus of claim 1, wherein each of the plurality of mirrors is positioned such that a space exists between each mirror and an adjacent mirror.

6. The apparatus of claim 5, wherein the corresponding element is arranged to project the patterned radiation beam through the space adjacent to a respective mirror in the array of mirrors.

7. A device manufacturing method, comprising:
using a respective one of a plurality of mirrors to project a radiation beam onto a corresponding element of an array of individually controllable elements;
patterning the radiation beam using the array of individually controllable elements;
changing an optical axis and a telecentricity of the radiation beam using the corresponding element of the array; and
projecting the patterned beam of radiation onto a substrate using a projection system.

8. The method of claim 7, further comprising arranging the plurality of mirrors such that a space exists between each mirror and an adjacent mirror.

9. The method of claim 8, arranging the corresponding element to project the patterned radiation beam through the space adjacent to a respective mirror in the array of mirrors.

10. The method of claim 7, further comprising arranging a reflective surface of the corresponding element of the array of individually controllable elements at an angle with respect to a central axis of the projection system.

* * * * *